United States Patent
Fang et al.

(10) Patent No.: US 8,637,918 B2
(45) Date of Patent: Jan. 28, 2014

(54) METHOD AND DEVICE EMPLOYING POLYSILICON SCALING

(75) Inventors: Shenqing Fang, Fremont, CA (US);
Chun Chen, San Jose, CA (US);
Wenmei Li, San Jose, CA (US); Inkuk Kang, San Jose, CA (US); Gang Xue, Sunnyvale, CA (US); Hyesook Hong, Allen, TX (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 13/294,098

(22) Filed: Nov. 10, 2011

(65) Prior Publication Data
US 2012/0056260 A1    Mar. 8, 2012

Related U.S. Application Data (62) Division of application No. 12/370,950, filed on Feb. 13, 2009, now Pat. No. 8,076,199.

(51) Int. Cl.
*H01L 29/792* (2006.01)
(52) U.S. Cl.
USPC .......................... 257/324; 257/326
(58) Field of Classification Search
USPC ................................. 257/324, 326
See application file for complete search history.

(56) References Cited

U.S. PATENT DOCUMENTS

| 5,899,713 | A * | 5/1999 | Acocella et al. ............. 438/201 |
| 6,020,610 | A * | 2/2000 | Ueno et al. .................... 257/315 |
| 6,436,778 | B1 | 8/2002 | Fang et al. |
| 7,029,976 | B1 | 4/2006 | Nagarad et al. |
| 7,217,610 | B2 | 5/2007 | Graf et al. |
| 8,076,199 | B2 | 12/2011 | Fang et al. |

OTHER PUBLICATIONS

Official Communication for U.S. Appl. No. 12/370,950 mailed Jul. 16, 2010.
Official Communication for U.S. Appl. No. 12/370,950 mailed Oct. 6, 2010.
Official Communication for U.S. Appl. No. 12/370,950 mailed Mar. 21, 2011.
Official Communication for U.S. Appl. No. 12/370,950 mailed Aug. 12, 2011.

* cited by examiner

*Primary Examiner* — Douglas Menz
(74) *Attorney, Agent, or Firm* — Sterne, Kessler, Goldstein & Fox P.L.L.C.

(57) ABSTRACT

A memory and method of manufacture employing word line scaling. A layered stack, including a charge trapping component and a core polysilicon layer, is formed on a core section and a peripheral section of a substrate. A portion of the layered stack, including the core polysilicon layer is then removed from the peripheral section. A peripheral polysilicon layer, which is thicker than the core polysilicon layer of the layered stack, is next formed on the layered stack and the peripheral section. The layered stack is then isolated from the peripheral polysilicon layer by removing a portion of the peripheral polysilicon layer from the core section, and polysilicon lines are patterned in the isolated layered stack.

10 Claims, 5 Drawing Sheets

METHOD AND DEVICE EMPLOYING POLYSILICON SCALING

CROSS-REFERENCE TO RELATED APPLICATIONS

This Utility Patent Application is a Divisional of U.S. patent application Ser. No. 12/370,950, filed on Feb. 13, 2009, entitled "Method and Device Employing Polysilicon Scaling," now U.S. Pat. No. 8,076,199 issued December 13, 2011, the benefit of which is hereby claimed under 35 U.S.C. § 120 and further incorporated herein by reference in its entirety.

FIELD OF THE INVENTION

The invention is related to a memory architecture, and in particular, but not exclusively to polysilicon lines employed in flash memory.

BACKGROUND OF THE INVENTION

A memory, such as a random access memory (RAM) or read only memory (ROM) often includes arrayed memory cells. Typically, each of the memory cells is coupled to at least one bit line and an overlapping word line, and each of the memory cells include a memory element that is configured to store a logic state. In operation, a controller reads from and/or writes to an individual memory element by receiving and transmitting signals over the bit and word lines of the memory.

Flash-based memories employ closely spaced and arrayed core memory cells. Peripheral devices, such as transistors and other devices, communicate voltage/current signals to a core cell array over the bit and word lines of the memory. In one example, the peripheral devices can include field effect transistors that are located, adjacent to the core cell array and controlled through a corresponding gate.

BRIEF DESCRIPTION OF THE DRAWINGS

Non-limiting and non-exhaustive embodiments of the present invention are described with reference to the following drawings, in which.

DETAILED DESCRIPTION OF THE INVENTION

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take the meanings explicitly associated herein, unless the context clearly dictates otherwise. The phrase "in one embodiment" as used herein does not necessarily refer to the same embodiment, though it may. Furthermore, the phrase "in another embodiment" as used herein does not necessarily refer to a different embodiment, although it may. Thus, as described below, various embodiments of the invention may be readily combined, without departing from the scope or spirit of the invention.

In addition, as used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and "the" include plural references. The meaning of "in" includes "in" and "on,"

Briefly stated, the invention is related to polysilicon scaling in a memory, such as in a flash-based memory employing single-bit or multi-bit memory cells. A layered stack, including a core polysilicon layer, is formed on a peripheral section and a core section of a substrate. A portion of the layered stack, including the core polysilicon layer, is removed from the peripheral section. A peripheral polysilicon layer, which is thicker than the core polysilicon layer of the layered stack, is then formed on the layered stack and the peripheral section. The layered stack is next isolated from the peripheral polysilicon layer by removing a portion of the peripheral polysilicon layer from the core section, and polysilicon lines are patterned in the isolated layered stack. In one embodiment, the polysilicon lines include at least one of word lines, source select gate lines, and/or drain select gate lines. In another embodiment, peripheral devices are formed in the peripheral polysilicon layer.

Figure 1:
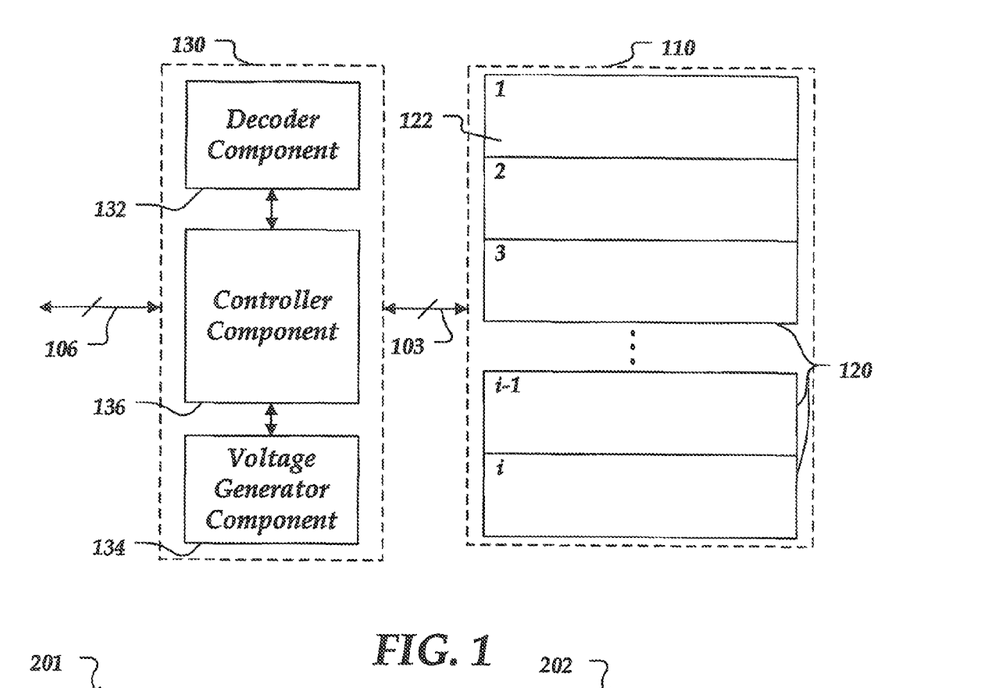
FIG. 1 is a block diagram of an embodiment of a memory.

FIG. 1 shows a memory environment in which embodiments of the invention may be employed. Not all the components illustrated in the figures may be required to practice the invention, and variations in the arrangement and type of the components may be made without departing from the spirit or scope of the invention. For example, although described in the context of a flash-based memory, the polysilicon scaling techniques described herein may be employed in manufacturing other types of microelectronic memories or devices other than memory.

As shown, memory 100 includes arrayed memory 110 and memory controller 130. Memory controller 130 is arranged to communicate addressing data and program data over signal path 106. For example, signal path 106 can provide 8, 16, or more I/O lines of data. Memory controller 130 is also configured to access arrayed memory 110 over signal path 103. For example, memory controller 130 can read, write, erase, and perform other operations at portions of arrayed memory 110 via signal path 103. In addition, although shown as single lines, signal path 103 and/or signal path 106 may be distributed across a plurality of signal lines and/or bus lines.

Arrayed memory 110 includes memory sectors 120 (identified individually as sectors that can be accessed via memory controller 130. Memory sectors 120 can include, for example, 256, 512, 1024, 2048 or more sectors having memory cells that can be individually or collectively accessed. In other examples, the number and/or arrangement of memory sectors can be different. In one embodiment, for example, sectors 120 can be referred to more generally as memory blocks and/or can be configured to have a configuration that is different than a bit line, word line, and/or sector topology.

Memory controller 130 includes decoder component 132, voltage generator component 134, and controller component 136. In one embodiment, memory controller 130 may be located on the same chip as arrayed memory 110. In another embodiment, memory controller 130 may be located on a different chip, or portions of memory controller 130 may be located on another chip or of chip. For example, decoder component 132, controller component 134, and voltage generator component 136 can be located on different chips but co-located on the same circuit board, In other examples, other implementations of memory controller 130 are possible. For example, memory controller 130 can include a programmable microcontroller.

Decoder component 132 is arranged to receive memory addresses via addressing signal path 106 and to select individual sectors, arrays, or cells according to the architecture of arrayed memory 110. For example, in a RAM-based architecture, decoder component 132 can be configured to select memory cells individually or collectively from a sector for read/write access. In a ROM-based memory architecture, decoder component 132 might not select memory cells individually but can provide read/write access to entire cell arrays (or pages) of memory cells. In another embodiment, decoder component 132 can be configured to select memory cells in a hybrid configuration, such as a ROM- and RAM-based hybrid configuration.

Decoder component 132 includes, for example, multiplexer circuits, amplifier circuits, combinational logic, or the like for selecting sectors, arrays, and/or cells based on any of a variety of addressing schemes. For example, a portion of a memory address (or a grouping of bits) can identify a sector within arrayed memory 110 and another portion (or another grouping of bits) can identify a core cell array within a particular sector.

Voltage generator component 134 is arranged to receive one or more supply voltages (not shown) and to provide a variety of reference voltages required for reading, writing, erasing, preprogramming, soft programming, and/or under-erase verifying operations. For example, voltage generator component 134 can include one or more cascode circuits, amplifier circuits, regulator circuits, and/or switch circuits that can be controlled by controller component 136.

Controller component 136 is arranged to coordinate reading, writing, erasing, and other operations of memory 100. In one embodiment, controller component 136 is arranged to receive and transmit data from an upstream system controller (not shown) Such a system controller can include, for example, a processor and a static random access memory (SRAM) that can be loaded with executable processor instructions for communicating over signal path 106. In another embodiment, controller component 136 as well as other portions of memory controller 130 may be embedded or otherwise incorporated into a system controller or a portion of a system controller.

Embodiments of controller component 136 can include a state machine and/or comparator circuits. State machine and comparator circuits can include any of a variety of circuits for invoking any of a myriad of algorithms for performing reading, writing, erasing, or other operations of memory 100. State machines and comparator circuits can also include, for example, comparators, amplifier circuits, sense amplifiers, combinational logic, or the like.

In one embodiment, memory 100 is a flash-based memory including flash-based memory cells, such as flash-based NAND cells, NOR cells, or hybrids of the two. In other embodiments, memory 100 may be another type of volatile or non-volatile memory, including, for example, a static random access memory (SRAM) or a dynamic random access memory (DRAM).

Figure 2:
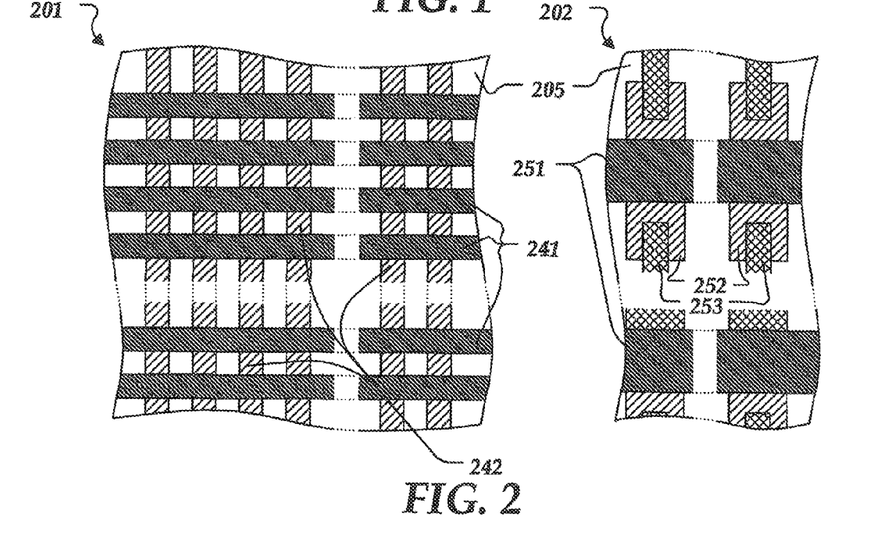
FIG. 2 is a partial top plan view of an embodiment of core and peripheral sections of a memory that may be employed in the memory of FIG. 1.

FIG. 2 shows a partial top plan view of separate sections of a memory. Core section 201, for example, may be an embodiment of a portion of sector 120 of FIG. 1 and may include arrayed core memory cells. Peripheral section 202, for example, may be an embodiment of memory controller 110 of FIG. 1 or a portion of memory controller 110 of FIG. 1.

Core section 201 includes core polysilicon lines 241, conductive regions 242, and a portion of substrate 205. Portions of core polysilicon lines 241 are coupled to the gates of individual memory cells (not shown in FIG. 2) and can be configured as a word line, a source select gate line, and/or a drain select gate line, Portions of conductive regions 242 can include, for example, p-type and/or n-type doped regions of substrate 205 for forming source/drain regions and/or conductive lines. For example, conductive regions 242 can form portions of bit lines and/or other signal lines. Also, in some embodiments, individual conductive regions 242 extend at least partially underneath individual core polysilicon lines 241.

In one embodiment, core section 201 is arranged in a NOR topology, and individual memory cells can be individually accessed via individual conductive regions 242. In another embodiment, core section 201 is arranged in a NAND topology, and individual memory cells can be accessed though individual conductive regions 242 collectively but not individually. In other embodiments, hybrid architectures can be employed. For example, core section 201 can be configured to have a portion that is NAND-based and another portion that is NOR-based. Typically, the pitch or spacing associated with memory cells depend on the architecture of core section 201. For example, a NAND-based architecture generally has a smaller pitch than a NOR-based architecture. In one embodiment, the pitch associated with core polysilicon lines 241 may be in a range of about 80 to 100 nm. Also, although not shown if FIG. 2, core section 201 may include any of a variety of interconnect and/or passivation layers, such as dielectric, conductive, or other layers. For example, conductive regions 242 can be positioned beneath a dielectric spacer layer (described further with reference to FIG. 3).

Peripheral section 202 includes peripheral polysilicon lines 251, conductive regions 252, and interconnects 253. Portions of peripheral polysilicon lines 251 are coupled to individual peripheral devices (not shown in FIG. 2). In general, the pitch associated with peripheral polysilicon lines 251 is greater than the pitch associated with core polysilicon lines 241.

Portions of conductive regions 252 can include, for example, p-type and/or n-type doped regions of substrate 205 for forming conductive features, such as a source, a drain, or other type of well. Interconnects 253 can include conductive lines that electrically intercouple portions of peripheral section 202 and/or electrically couple core section 201 with peripheral section 202. For example, interconnects 253 can include a combination of metal lines and vias. Also, although not shown FIG. 2, peripheral section 202 may also include any of a variety of other interconnect and/or passivation layers.

Figure 3:
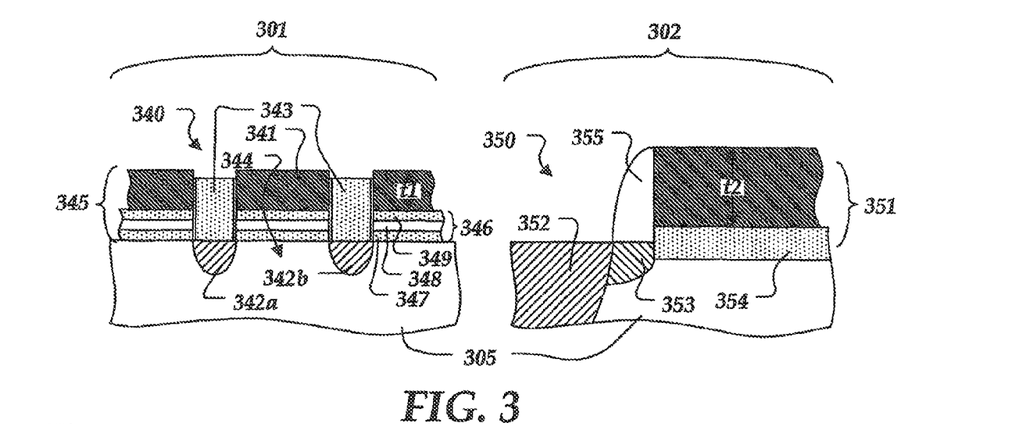
FIG. 3 is a cross-sectional side view of an embodiment of the core and peripheral sections of FIG. 2.

FIG. 3 shows a cross-sectional side view of a memory cell in core section 301 and a peripheral component in a peripheral section 302. In one embodiment, core section 301 is an embodiment of core section 201 of FIG. 2, and peripheral section 302 is an embodiment of peripheral section 202 of FIG. 2.

Memory cell 340 includes a portion of substrate 305, dielectric spacer layer 343, channel region 344, source/drain regions 342a and 342b, and layered stack 345, including charge trapping component 346 and a portion of core polysilicon line 341. Substrate 305 may be an embodiment of substrate 205 of FIG. 2. Source/drain regions 342a and 342b may be an embodiment of one or more conductive regions 242 of FIG. 2. Core polysilicon line 341 may be an embodiment of an individual core polysilicon line 241 of FIG. 2.

In operation, core polysilicon line 341 and source/drain regions 342a and 342b are configured to provide electrical potential(s) to memory cell 340 for trapping charge at charge trapping component 346. A bit is "programmed" when it is trapping a charge and "unprogrammed" when it is not trapping charge. To trap charge, charge trapping component 346 employs tunneling layer 347, charge trapping layer 348, and dielectric layer 349. In general, tunneling layer 347 provides a tunneling barrier, charge trapping layer 348 is a layer that is configured to store charge, and dielectric layer 349 electrically isolates charge trapping layer 348 from core polysilicon line 341. In one embodiment, memory cell 340 is a one bit memory cell that is configured to store up to two logic states. In another embodiment, memory cell 340 can store more than two logic (or bit) states.

Peripheral component 350 is a portion of a peripheral device, such as a field effect transistor, and includes a portion of substrate 305, gate oxide layer 354, spacer 355, implant regions 352 and 353, and a portion of peripheral polysilicon line 351. Implant regions 352 and 353 may be an embodiment of one or more conductive regions 252 of FIG. 2. Peripheral polysilicon line 351 may be an embodiment of an individual peripheral poly silicon line 251 of FIG. 2. In one embodiment, gate oxide layer 354 may be a high voltage gate oxide for providing read/write voltages to core memory cell 340 (e.g., in the range of about 10 to 20 V). Accordingly, in such an embodiment, peripheral polysilicon line 351 can form a portion of a high-voltage field effect transistor. In other, non-illustrated embodiments, peripheral component 350 can be configured differently. For example, peripheral component 350 can be a portion of other types of electrical devices, such as a capacitor, bipolar junction transistor, or the like; mechanical devices; as well as other types of electro-mechanical devices. Further, peripheral component 350 can also be configured differently and various other features may be added to or omitted from peripheral component 350. Also, in some embodiments, implant regions 352 and 353, gate oxide layer 354, and/or spacer 355 may be omitted, depending on the type of device that peripheral component is incorporated into.

In contrast to conventional memory arrangements, core polysilicon line 341 of core memory cell 340 is thinner than peripheral polysilicon line 351 of peripheral component 350. In particular, thickness t1 of core polysilicon line 341 is less than thickness t2 of peripheral polysilicon line 351. Conventional memory arrangements, on the other hand, employ a uniform polysili con layer having the same thickness in a core section and a peripheral section. Typically, conventional manufacturing processes deposit and pattern a single polysilicon layer in both the core and periphery sections.

Embodiments of the present invention, by contrast, employ a manufacturing process that employs separate polysilicon in the core and periphery sections of a memory. Despite introducing an additional manufacturing step, a variety of the process and device enhancements can be achieved, including control of core polysilicon line profile and control of silicon nitride stringers (for silicon nitride based charge trapping components); independent optimization of core polysilicon and peripheral polysilicon; improved core polysilicon spacer fill due to lower polysilicon line aspect ratios; and reduced capacitance between individual core polysilicon In addition, embodiments of the present invention can be employed to improve yield. For example, embodiments of dielectric spacer layer 343 improves yield by sealing source/drain regions during subsequent manufacturing, preventing particle and residue accumulation. (see, e.g., FIG. 10). Further, embodiments of the present invention can be implemented without increasing the overall mask count for a process flow.

Figure 4:
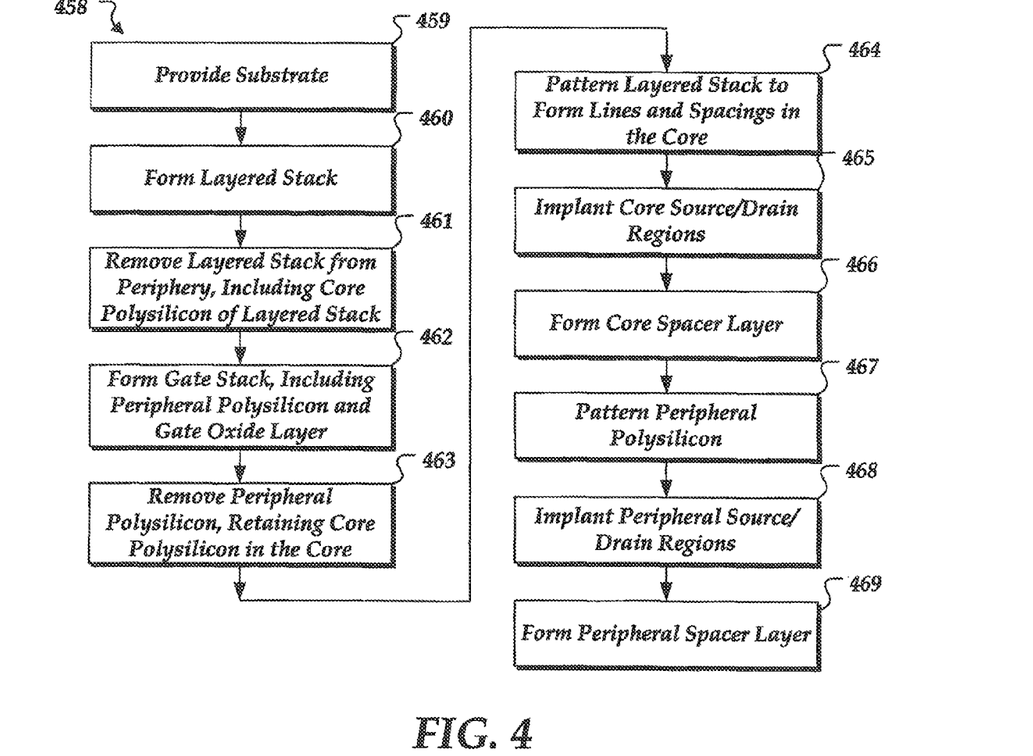
FIG. 4 is a processing flow diagram generally showing one embodiment of a process for polysilicon scaling.

FIG. 4 is a processing flow diagram generally showing one embodiment of process 458 for manufacturing core and peripheral sections of a memory. In one embodiment, process 458 is employed to form memory cell 340 and peripheral component 350 of FIG. 3. The invention, however, is not so limited, and process 458 may be employed to form other embodiments of core and peripheral sections of a memory. in one embodiment each of blocks 459-469 can be performed sequentially. However, in another embodiment, individual blocks can be performed in parallel and/or in a different order.

Process 458 begins at block 459, where a substrate is provided. A substrate can include any of a wide variety of supporting materials in which microelectronic devices and other structures of a memory may be formed. In general, a substrate includes one or more semiconductor materials, such as a group IV semiconductor material or compound semiconductor materials. Group IV materials include, for example, silicon, germanium, or the like. Compound semiconductor materials include, for example, Gallium Arsenide, Indium Phosphide, or the like. Although primarily discussed n the context of silicon-based semiconductor processing, other embodiments of substrates may be employed.

Also, in some embodiments, a substrate can be pre-processed prior to block 459. In one embodiment, a substrate may include pre-formed features for forming memory cells or other devices in the substrate, such as transistors, capacitors, resistors, other devices. In one embodiment, a pre-processed substrate includes a shallow trench isolation (ST!) layer.

Further, although not described with reference to the figures, any of a variety of intermediary processes may be employed between individual block of process 458, such as cleaning, metrology, inspection, and/or other processes. For example, a variety of wet cleaning and/or dry cleaning processes may be used to prepare a substrate or remove a masking layer.

Processing continues to block 460, where a layered stack is formed on the substrate. The layered stack includes a charge trapping component and a core polysilicon layer. In one embodiment, the layered stack is formed by depositing a tunneling layer on a substrate, a charge trapping layer on the tunneling layer, a dielectric layer on the charge trapping layer, and the core polysilicon layer on the dielectric layer. In another embodiment, an etch stop layer is formed on the core polysilicon layer. For example, the etch stop layer may be employed to mask the core polysilicon layer while patterning a peripheral polysilicon layer (described further with reference to FIG. 7).

In general, any of a wide variety of thermal and/or thin film deposition processes may be employed to form each layer of the layered stack. Thermal deposition processes can include, for example, wet and/or dry thermal oxidation processes. Thin film deposition processes can include, for example, chemical vapor deposition (CVD), physical vapor deposition (PVD), plasma enhanced CVD (PECVD), atomic layer deposition (ALD), or the like. In one embodiment, the charge trapping layer is formed by depositing a non-conductive semiconductor layer on the tunneling layer. For example, stochiometric silicon nitride or a silicon rich silicon nitride can be deposited on a tunneling layer. In some embodiments, the tunneling, dielectric, and/or etch stop layers are formed by growing and/or depositing a silicon oxide.

Embodiments of the core polysilicon layer are formed by depositing doped and/or undoped polysilicon on the charge trapping component. Embodiments of the core polysilicon layer can be selected to have any of variety of thicknesses that are less than the thickness of a peripheral polysilicon layer. For example, the core polysilicon can have a thickness that is in a range of about 300 to 900 A. Such thicknesses typically cannot be employed in the peripheral section due to device specifications. For example, power transistors and other high voltage devices generally require a polysilicon thickness that is thicker than 1000 A or more. Also, although described herein in the context of polycrystalline silicon, the invention is not so limited, and any of a variety of types of amorphous silicon may be employed to form the core polysilicon layer and/or or peripheral polysilicon layer.

Processing continues to block 461, where the layered stack undergoes one or more patterning processes to remove a portion of the layered stack that is located at a peripheral section of the substrate. In particular, the core polysilicon (as well as the other layers of the patterned stack) are removed from the peripheral section.

In general, patterning processes can include any of a wide variety of combinations of photolithographic and etching processes. Photolithographic process can include, for example, single- or multi-step photolithographic techniques employing one or more photoresist masks, such as a photolithographic mask including UV or deep UV light sensitive materials and optionally back anti-reflective coatings (BARe). Etching processes can include, for example, one or more wet and/or dry etch techniques to etch through a photoresist mask and create patterned features in an underlying layer or substrate, including chemical and/or physical etching techniques, employing, for example, isotropic or anisotropic wet and/or dry etch chemistries, reactive ion etches, and/or plasma assisted etches. Also, in some embodiments, a photoresist mask layer can also be employed in combination with a "hard" mask, such as a carbon or silicon nitride hard mask.

Processing continues to block 462, where a gate stack is formed on the peripheral section of the substrate. The gate stack includes a peripheral polysilicon layer that is located on the peripheral and core sections of the substrate. The gate stack can also include an oxide layer under the peripheral polysilicon layer in the peripheral section of the substrate.

In one embodiment, one or more thermal and/or thin film deposition processes may be employed to form the peripheral polysilicon layer and the oxide layer of the gate stack. In another embodiment, such processes may be employed to form the peripheral polysilicon layer such that it is thicker than the core polysilicon layer. In one embodiment, the peripheral polysilicon layer has a thickness in range of about 1000 to 2000 A.

Processing continues to block 463, where the peripheral polysilicon layer undergoes one or more patterning processes to isolate the layered stack. In particular, such patterning processes remove the portion of the peripheral poly silicon layer in the core section. In one embodiment, an etch stop layer, formed at block 460, is employed to mask the layered stack in the core section while the peripheral polysilicon layer is patterned to remove the peripheral polysilicon from the core section.

Processing continues to 464, where one or more pattering processes are performed on the layered stack to form lines and spacings in the layered stack. In one embodiment, individual core polysilicon lines are formed by patterning spacings in the layered stack that open to surface portions of the substrate. In another embodiment, individual core polysilicon lines are formed by patterning spacings in the layered stack that open to surface portions of the charge trapping component. In some embodiments, due to the relative thinness of the core polysilicon layer, a patterning process may omit a carbon hard mask or other supplemental mask layer.

Processing continues to block 465, where source/drain, regions are formed in the core section by ion implantation through the spacings of the layered stack. In one embodiment, the implant dose may be low enough such that a blanket implant may be employed without the use of photoresist layer for masking the core section.

In general, an ion implantation process may achieve a desired impurity concentration in the source/drain regions by employing various doses of implant species to open areas of the substrate through the etched layered stack. Source/drains that are n-type, for example, can be formed by n-type implant species, such as phosphorous (P), arsenic (As), or antimony (Sb). Source/drains that are p-type, for example, can be formed by p-type implant species, such as boron (B) or aluminum (Al). Also, an ion implantation process may employ various implantation energies to achieve a desired depth of implant species. Further, an ion implantation process can be employed in combination with a thermal diffusion process Processing continues to block 466, where a dielectric spacer layer is formed in the core section by a thin film deposition process. In some embodiments, one or more thermal and/or thin film deposition process may also be employed to form a liner in the spacings of the layered stack. Such liners can include, for example, a silicon oxide or polymeric material.

In one embodiment, the isolation dielectrics include a high density plasma (HDP) oxide. In another embodiment, the isolation dielectrics include a tetra-ethyl-ortho-silicate (TEOS) oxide or an ozone based TEOS. In one embodiment, a chemical mechanical polishing (CMP) process can planarize the isolation dielectrics such that the dielectric spacer layer is flush with a surface of the core polysilicon layer or recessed below the surface of the core polysilicon layer.

As discussed above, the dielectric spacer layer can seal the spacings of the layered stack, preventing particle and/or residue accumulation. In contrast, conventional manufacturing methods, because they form the core and peripheral sections concurrently, do not seal the spacings of a layered stack until after the features of the peripheral polysilicon is formed. For example, in conventional manufacturing methods, blocks 468 and 469 (described below) would be formed while the spacings of the layered stack remain open.

Processing continues to block 467, where the peripheral polysilicon of the peripheral section of the memory is patterned. In one embodiment, a gate stack may be patterned by one or more patterning processes. In another embodiment, other features may be formed in the peripheral polysilicon.

Processing continues to block 468, where implant regions, such as source/drain implant regions, are formed in the peripheral section. In one embodiment, the peripheral section may undergo four or more separate ion implantation processes. As discussed above, the dielectric spacer layer can protect the core section during such ion implantation processes. Also, the dielectric spacer layer can protect the core section during photoresist masking and photoresist strip and clean.

Processing continues to block 469, where another dielectric spacer layer is formed in the peripheral section by a thin film deposition process. In particular, the spacer layer in the peripheral section is separate from the spacer layer of the core section. In some embodiments, one or more thermal and/or thin film deposition process may also be employed to form the spacer layer in the peripheral section.

Although not illustrated, processing may continue to form other features of the core and peripheral sections of the memory. Also, additional processing may form inter-level dielectric layers and conductive layers to interconnect various portions of the core and peripheral sections of the memory. Further, the core and peripheral sections may be cleaved to form individual dies or chips that may be incorporated into a packaged device or other device. A person skilled in the art would appreciate the various manners in which such processing and packaging may be carried out.

Moreover, a variety of simulation and/or software tools may be employed to create a specific implementation of core and periphery sections of a memory. High-level software code, such as a register transfer logic (RTL) file, may be created and then compiled to form a netlist file. The netlist file may be used in turn to optimize the core and periphery sections of in the memory. A physical design process may be employed in conjunction with the netlist file and a component library to create a layout file. The layout file may be used to create a mask file that may be provided to a device foundry to equip the foundry for manufacturing a memory containing the core and peripheral section of the memory.

FIGS. 5-10 illustrate various embodiments of stages corresponding to the manufacture of core and peripheral sections of a memory. In one embodiment, the various stages represent stages of manufacturing core section 301 and peripheral section 302 of FIG. 3. In another embodiment, the various stages employ one or more blocks associated with the process flow described with reference to FIG. 4. In other embodiments, the various stages employ additional or alternative steps.

Figure 5:
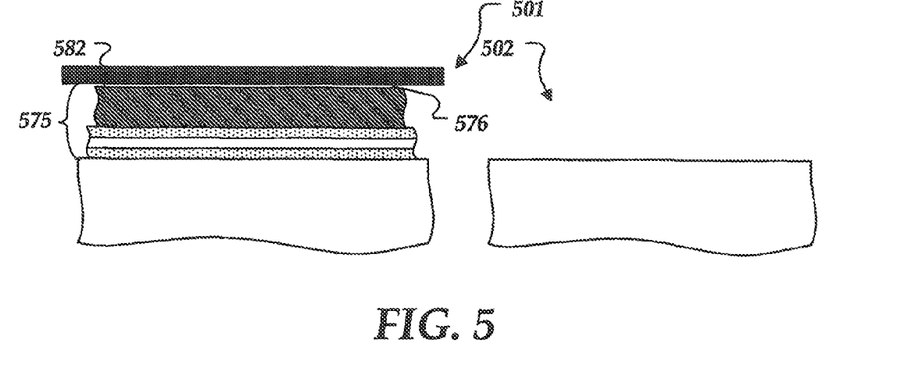
FIGS. 5-10 illustrate embodiments of stages corresponding to the manufacture of core and peripheral sections of a memory.

FIG. 5 is an embodiment showing a cross-sectional side view of core section 501 and peripheral section 502 that includes layered stack 575, etch stop layer 576, and mask 582 covering layered stack 575. In one embodiment, etch stop layer 576 is a thin film oxide or polymer layer. In another embodiment, mask 582 is a photoresist mask, in one embodiment, the cross-sectional side view of FIG. 5 corresponds to processing associated with block 461 of process 458 of FIG. 4.

Figure 6:
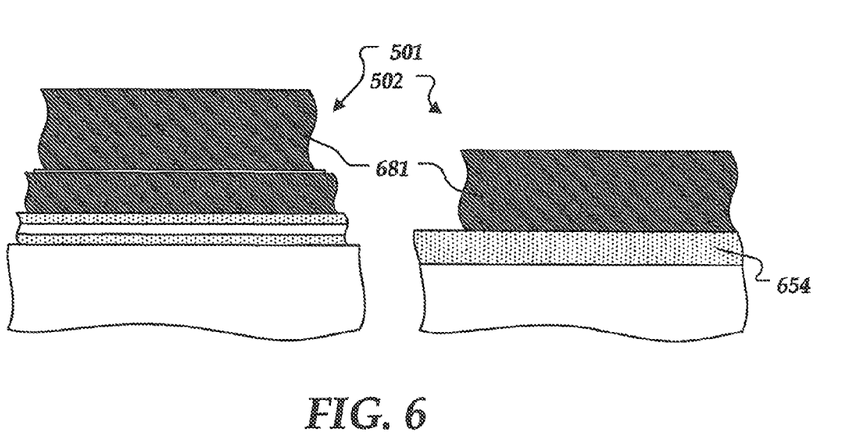

FIG. 6 is an embodiment showing a cross-sectional side view of core section 501 and peripheral section 502 after peripheral polysilicon layer 681 has been globally deposited. FIG. 6 also shows gate oxide 654, which in one embodiment may form a portion of a gate stack, In one embodiment, the cross-sectional side view of FIG. 6 corresponds to processing associated with block 462 of process 458 of FIG. 4.

Figure 7:
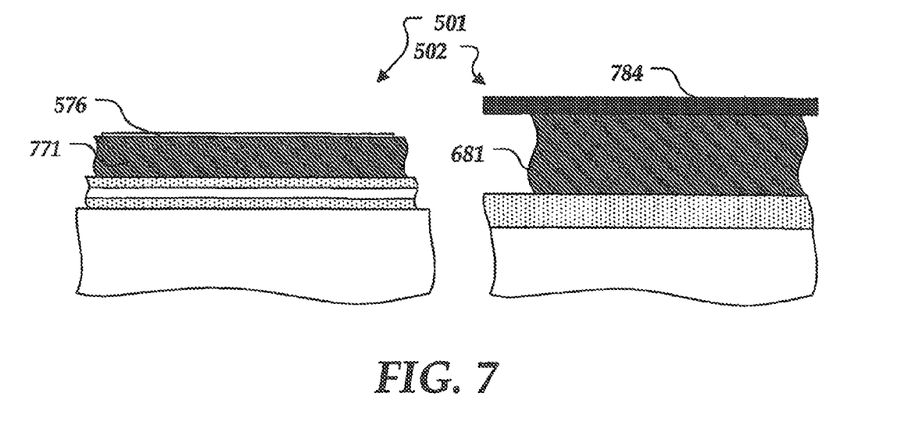

FIG. 7 is an embodiment showing a cross-sectional side view of core section 501 and peripheral section 502 that includes mask layer 784 covering a portion of peripheral polysilicon layer 681 and etch stop layer 576. In one embodiment, etch stop layer 576 may be removed from core polysilicon layer 771 after an etching process. In one embodiment, the cross-sectional side view of FIG. 7 corresponds to processing associated with block 463 of process 458 of FIG. 4.

Figure 8:
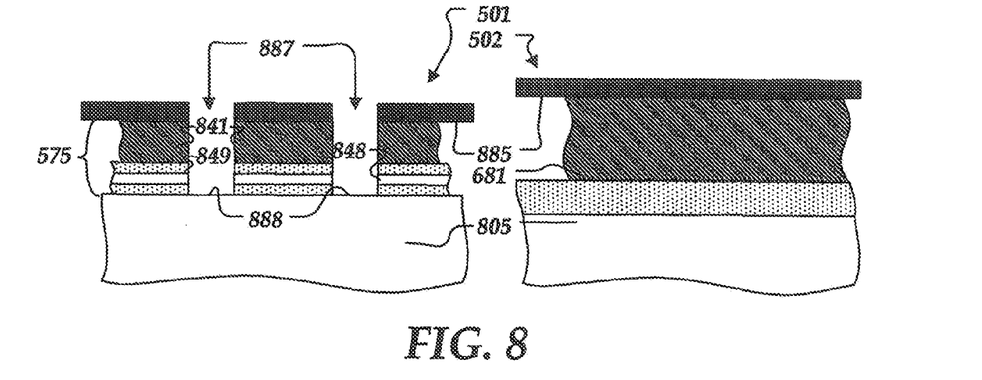

FIG. 8 is an embodiment showing a cross-sectional side view of core section 501 and peripheral section 502 that includes mask layer 885 covering portions of layered stack 575 and peripheral polysilicon layer 681. Mask layer 885 defines the locations of polysilicon lines 841 and spacings 886 in layered stack 575. As used herein the terms "define", "defined", or "defining" refer to a process associated with patterning, etching, and/or otherwise forming a size, shape, and/or a portion of a shape associated with a feature, opening, recess, or other aspect of a substrate, microelectronic layer, and/or other layer. In the embodiment of FIG. 8, spacings 886 open to surface portions 887 of substrate 805. In another embodiment, spacings 886 may open to one of the layers of layered stack 575, such as charge trapping layer 848 or dielectric layer 849 of layered stack 575. In one embodiment, the cross-sectional side view of FIG. 8 corresponds to processing that has completed block 464 of process 458 of FIG. 4.

Figure 9:
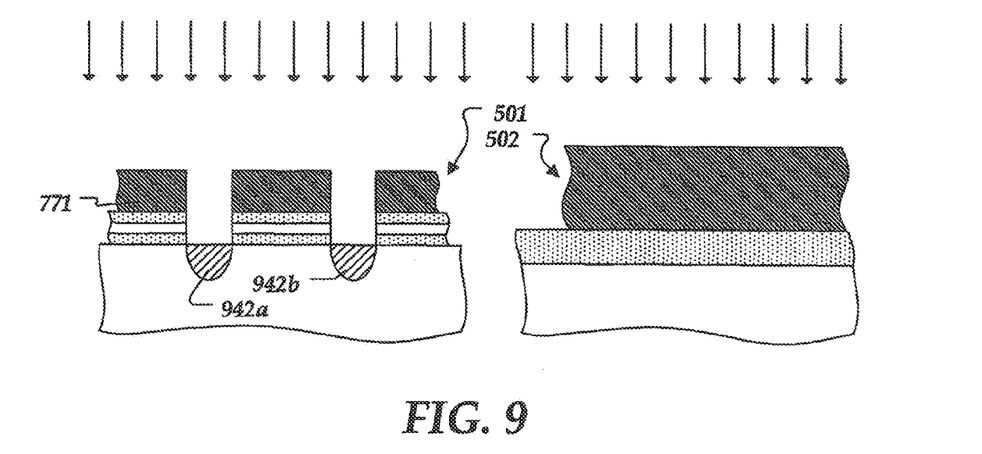

FIG. 9 is an embodiment showing a cross-sectional side view of core section 501 and peripheral section 502 that includes source/drain regions 942a and 942b formed by an ion implantation process. FIG. 9 also shows core polysilicon layer 771 serving as a diffusion mask. In one embodiment, the cross-sectional side view of FIG. 9 corresponds to processing that has completed block 465 of process 458 of FIG. 4.

Figure 10:
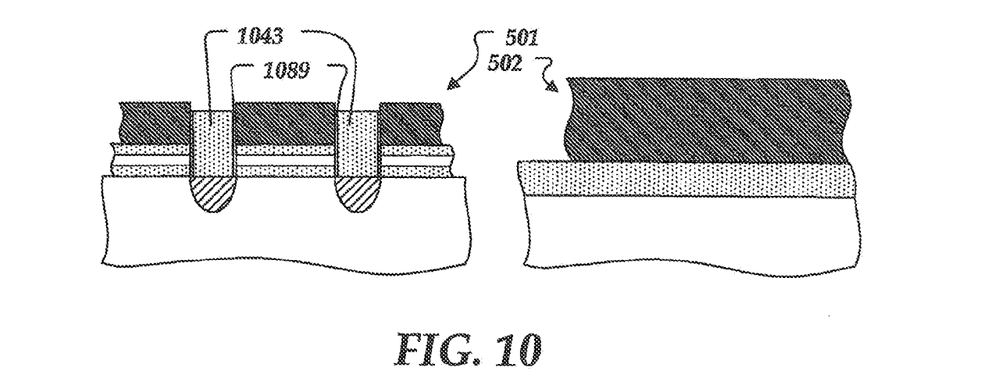

FIG. 10 is an embodiment showing a cross-sectional side view of core section 501 and peripheral section 502 that includes dielectric spacer layer 1063 and liner layer 1089 formed in a portion of spacings 886 of FIG. 8. In one embodiment, the cross-sectional side view of FIG. 10 corresponds to processing that has completed block 466 of process 458 of FIG. 4.

Although not illustrated, processing may continue. For example, processing can complete blocks 467-469 of process 458 of FIG. 4. In one embodiment, peripheral polysilicon layer 681 and gate oxide layer 654 may be patterned to form a patterned gate stack. In another embodiment, implant regions 352 and 353 and spacer 355 of FIG. 3 may be formed in substrate 505. Also, substrate 505 may eventually be cleaved or cut in various manners to form individual dies or chips that may be incorporated into a packaged device or other device.

Figure 11:
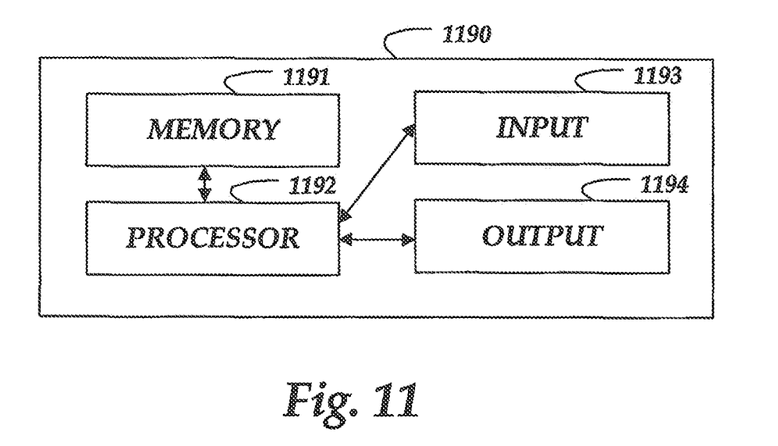
FIG. 11 is a block diagram of an embodiment of a system that employs polysilicon scaling in memory.

Embodiments of devices employing polysilicon scaling can be incorporated into any of a variety of components and/or systems, including for example, a memory and other components or systems of such components. FIG. 11 shows one embodiment of a system (1190) that employs polysilicon scaling in memory 1191. Memory 1191 may include, for example, anyone of the aforementioned memories, such as single-bit, dual-bit, or multi-bit flash memory. Memory 1191 can be directly or indirectly to anyone of processor 1192, input devices 1193, and/or output devices 1194. In one embodiment, memory 1191 may be configured such that it is removable from system 1190. In another embodiment, memory 1191 may be permanently connected to the components or a portion of the components of the system 1190.

In some embodiments, memory 1191, processor 1192, input devices 1193 , and/or output devices 1194 of system 1190 are configured in combination to function as part of a larger system, For example, system 1190 may be incorporated into a cell phone, a handheld device, a laptop computer, a personal computer, and/or a server device. In addition or alternatively, system 1190 can perform any of variety of processing, controller, and/or data storage functions, such as those associated with sensing, imaging, computing, or other functions. Accordingly, system 1190 can be incorporated into any of wide variety of devices that may employ such functions (e.g., a digital camera, an MP3 player, a GPS unit, and so on).

The above specification, examples and data provide a description of the manufacture and use of the composition of the invention. Since many embodiments of the invention can be made without departing from the spirit and scope of the invention, the invention also resides in the claims hereinafter appended.

What is claimed as new and desired to be protected by Letters Patent of the United States is:

1. A memory, comprising:
a substrate;
one or more core memory cells that each include:
    a charge trapping component located on a portion of the substrate,
    wherein the charge trapping component includes a charge trapping layer; and
    a portion of a word line residing on a portion of the charge trapping component, wherein the word line includes a portion of a core polysilicon layer; and
one or more peripheral devices residing on another portion of the substrate,
wherein the peripheral devices include a portion of a peripheral polysilicon layer, wherein the peripheral polysilicon layer is thicker than the core polysilicon layer,
wherein the portion of the core polysilicon layer has a different line profile than the portion of the peripheral polysilicon layer, and
wherein a height of the one or more core memory cells relative to a surface of the substate is different from a height of the one or more peripheral devices relative to surface of the substrate.

2. The memory of claim 1, wherein the peripheral devices include:
    a transistor configured to at least one of select a portion of the core memory cells for read/write access or provide an electrical signal to the core memory cells for at least one of programming or erasing.

3. The memory of claim 1, wherein the one or more core memory cells each include a barrier layer, a charge trapping layer on the tunneling barrier, and a dielectric layer on the charge trapping layer, wherein the charge trapping layer is configured to store two logic states.

4. The memory of claim 1, wherein the portion of the core polysilicon layer is different from the portion of the peripheral polysilicon layer in with respect to a presence of silicon nitride stringers.

5. The memory of claim 4, wherein the portion of the core polysilicon layer has a different line aspect ratio than the portion of the peripheral polysilicon layer in line aspect ratios.

6. The memory of claim 1, wherein the one or more peripheral devices comprise a transistor configured to provide read and write voltages in the range of 10V to 20V.

7. The memory of claim 1, wherein the core polysilieon layer and the charge trapping component of the one or more core memory cells together form a layered stack and wherein the one or more core memory cells further comprise a dielectric spacer that seals spacings of the layered stack.

8. A memory, comprising:
a substrate;
one or more core memory cells that each include:
    a charge trapping component located on a portion of the substrate, wherein the charge trapping component includes a charge trapping layer; and
    a portion of a word line residing on a portion of the charge trapping component, wherein the word line includes a portion of a core polysilicon layer; and
one or more peripheral devices residing on another portion of the substrate, wherein the peripheral devices include a portion of a peripheral polysilicon layer, wherein the peripheral polysilicon layer is thicker than the core polysilicon layer, wherein the core polysilicon layer has a thickness in a range of about 300 to 900 Å, wherein the peripheral polysilicon layer has a thickness in range of about 1000 to 2000 Å, and wherein a height of the one or more core memory cells relative to a surface of the substrate is different from a height of the one or more peripheral devices relative to the surface of the substrate.

9. A memory, comprising:
a substrate;
one or more core memory cells that each include:
    a charge trapping component located on a portion of the substrate, wherein the charge trapping, component includes a charge trapping layer; and
    a portion of a word line residing on a portion of the charge trapping component, wherein the word line includes a portion of a core polysilicon layer; and
one or more peripheral devices residing on another portion of the substrate,
wherein the peripheral devices include a portion of a peripheral polysilicon layer, wherein the peripheral polysilicon layer is thicker than the core polysilicon layer,
wherein the memory cells are arrayed according to a first pitch,
wherein the peripheral devices are arrayed according to a second pitch that is greater than the first pitch, and
wherein a height of the one or more core memory cells relative to a surface of the substrate is different from a height of the one or more peripheral devices relative to the surface of the substrate.

10. A memory; comprising:
a substrate;
one or more core memory cells that each include:
    a charge trapped component located on a portion of the substate, wherein the charge trapping component includes a charge trapping layer; and
    a portion of a word line residing on a portion of the charge trapping component, wherein the word line includes a portion of a core polysilicon layer; and
one or more peripheral devices residing on another portion of the substrate, wherein the peripheral devices include a portion of a peripheral polysilicon layer,
wherein the core polysilicon layer has a thickness less than 1000 Å,
wherein the peripheral polysilicon layer has a thickness greater than 1000 Å, and
    wherein a height of the one or more core memory cells relative to a surface of the substrate is different from a height of one or more peripheral devices relative to the surface of the substrate.

* * * * *

UNITED STATES PATENT AND TRADEMARK OFFICE
CERTIFICATE OF CORRECTION

PATENT NO.         : 8,637,918 B2
APPLICATION NO.    : 13/294098
DATED              : January 28, 2014
INVENTOR(S)        : Fang et al.

Page 1 of 1

It is certified that error appears in the above-identified patent and that said Letters Patent is hereby corrected as shown below:

In the Claims:

Column 11, lines 24-25, Claim 1, "to surface of" should read --to the surface of--;

Column 11, lines 48-49, Claim 7, "core polysilieon layer" should read --core polysilicon layer--;

Column 12, line 19, Claim 9, "trapping, component" should read --trapping component--; and Column 12, line 41, Claim 10, "trapped component" should read --trapping component-- and "height of one" should read --height of the one--.

Signed and Sealed this
Twenty-sixth Day of August, 2014

Michelle K. Lee
*Deputy Director of the United States Patent and Trademark Office*